United States Patent [19]

Jenner et al.

[11] Patent Number: 4,780,086

[45] Date of Patent: Oct. 25, 1988

[54] ELECTRICAL INTERFACE ARRANGEMENT

[75] Inventors: Frank H. Jenner, Hertfordshire; Ricki E. White, Bedfordshire; Patrick C. Thompson, Hertfordshire, all of United Kingdom

[73] Assignee: Marconi Instruments Limited, St. Albans, United Kingdom

[21] Appl. No.: 100,070

[22] Filed: Sep. 23, 1987

[30] Foreign Application Priority Data

Sep. 23, 1986 [GB] United Kingdom ............... 8622878

[51] Int. Cl.$^4$ .............................................. H01R 9/09
[52] U.S. Cl. .................................. 439/42; 324/158 F; 439/131; 439/197; 439/485
[58] Field of Search ............... 439/41, 42, 131, 132, 439/197, 485; 324/73 PC, 158 F

[56] References Cited

U.S. PATENT DOCUMENTS

| | | | |
|---|---|---|---|
| 4,017,793 | 4/1977 | Haines | 324/73 PC |
| 4,230,985 | 10/1980 | Matrone et al. | 439/41 |
| 4,344,033 | 8/1982 | Stowers et al. | 439/42 |
| 4,643,501 | 2/1987 | Coffin | 439/132 |
| 4,667,155 | 5/1987 | Coiner et al. | 324/73 PC |

Primary Examiner—J. Patrick McQuade
Attorney, Agent, or Firm—Lowe, Price, LeBlanc, Becker & Shur

[57] ABSTRACT

In an interface arrangement for automatic test equipment a substrate, such as a circuit board, is supported between spring loaded test probes within a vacuum chamber so that application of a vacuum causes the probes to contact the board. An internal dam is mounted within the vacuum chamber and, upon the application of the vacuum, seals off an internal portion of the chamber containing the probe arrays so that cooling air may be applied to the circuit board without breaking the vacuum in the outer portion of the chamber. Access may also be provided to the circuit board in this condition.

12 Claims, 2 Drawing Sheets

ELECTRICAL INTERFACE ARRANGEMENT

This invention relates to an electrical interface arrangement in which an array of conductive probes is brought into electrical contact with a circuit board to facilitate the testing of it and/or of electrical components mounted on the circuit board.

As circuit boards, and the components which are mounted upon them, become more complex, greater and greater numbers of conductive probes are required to make contact to all of the circuit nodes which need to be tested. Our co-pending application Ser. No. 8,505,566 describes a vacuum test fixture in which a circuit board or other substrate is supported within a vacuum chamber and application of a vacuum causes spring loaded test probes to make electrical contact with both sides of the circuit board. This is a particularly useful apparatus since it enables a large number of probes to be brought into good electrical contact with the circuit board and, of course, since double sided and multilayer circuit boards are now becoming common it is often required to make electrical contact on both sides of the board for test purposes. Such a system allows this.

However, under certain conditions of test, components on the circuit board can overheat which may affect their performance and/or lifetime. Furthermore, it may be desirable to access the circuit board during testing, for instance to adjust potentiometers, switches, etc. This is not possible with the vacuum test fixture described in application Ser. No. 8,505,566. The present invention provides a modification to the vacuum test fixture which helps to overcome these and other problems.

According to the present invention there is provided an electrical interface arrangement for coupling a circuit board to electrical test equipment including two arrays of conductive probes which are spaced apart from each other and at least one of which is attached to a moveable wall portion of an evacuatable chamber, a reduction in pressure of which serves to move the two arrays towards each other so as to sandwich a circuit board between them, and partitioning means, actuated by the reduction in pressure, for partitioning the evacuatable chamber into at least a first and second separate sub-chamber, sealed from each other such that the pressure in one sub-chamber is substantially unaffected by pressure variation in the other chamber.

The partitioning means may comprise a wall-like member, hereinafter termed a dam, mounted to a surface of the evacuatable chamber such that upon the reduction in pressure and consequent movement of the probe arrays, the dam contacts an opposing surface of the chamber around its entire perimeter and hence defines and seals the first sub-chamber. The dam preferably includes a resilient elastomeric or rubber material for making a good vacuum seal.

The dam, or other partitioning means, may alternatively be associated with a floating plate mounted between the probe arrays and perforated such that the probes can pass through it to contact a circuit board mounted upon it.

In general, the dam or other partitioning means is positioned such that the circuit board to be tested is mounted entirely within the first subchamber.

The first sub-chamber preferably includes valve means to restore atmospheric pressure in this portion while the second sub-chamber remains evacuated under vacuum. A cooling air flow may be provided via the valve means to reduce overheating effects or indeed any other gas may be provided if environmental testing of the circuit board is required. Means may also be provided for allowing access to the upper surfaces of the board under test.

The interface arrangement may include means for making electrical paths between electrical equipment and one array of the probes which is associated with one surface of the circuit board by action related to the reduction in pressure.

The evacuatable chamber may include resilient means, preferably including compression springs, acting in opposition to the forces exerted when the chamber is evacuated and also include pressure equalisation means. The resilient means and equalisation means may cooperate so that when pressure is reinstated in the second subchamber, the resilient means serve to move the conductive probe arrays apart from each other.

In operation, the full extent of the evacuatable chamber is used to initially draw the two probe arrays together. After the chamber has been separated into two portions, which are preferably an inner and outer portion, and pressure has been reinstated in the inner portion then only the vacuum pressure of the outer portion serves to hold the probe arrays in contact with a circuit board under test. A source of cooling air may be applied to the circuit board and, alternatively or additionally any other desired processes may be performed upon the circuit board.

Embodiments of the invention will now be described by way of example only with reference to the accompanying drawings, in which.

Figure 1:
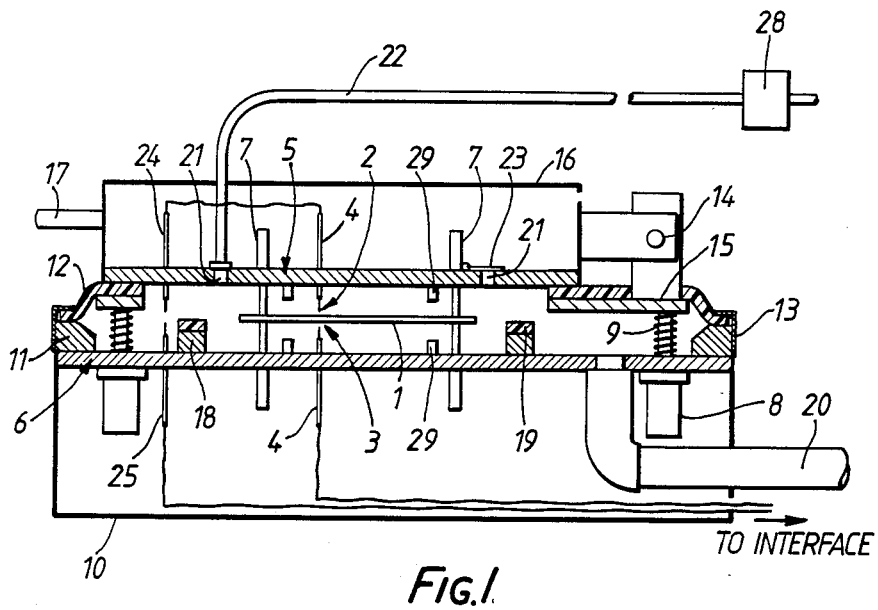
FIG. 1 shows diagrammatically in cross-section, apparatus according to the present invention in a first "loading" position.

In FIG. 1, a circuit board 1 to be tested is shown mounted within an electrical interface according to the invention. The circuit board 1 may be a printed circuit board in which conductive tracks are formed on one or more sides of an insulating substrate. The electrical interface for testing the circuit board includes an upper and lower array, each consisting of many electrically conductive probes of which only two exemplary probes are shown in the Figure. The upper surface of the circuit board 1 may be contacted by probe 2 and the lower surface by probe 3. Each probe is mounted in a spring loaded telescopic fashion within a housing 4 which is itself located within respective apertures in two upper and lower bed plates 5 and 6. The circuit board 1 is supported between the bed plates by means of four telescopic spring loaded location supports 7 of which only two are shown, these being positioned towards the corners of the circuit board. The bed plates are mounted and located by means of telescopic supports 8 with compression springs 9 around the perimeter of the lower bed plate 6. Lower bed plate 6 is mounted firmly within a supporting enclosure 10 such that there is space underneath the bed plate. A raised support 11 is placed around the edge of lower bed plate 6 and over this, around its perimeter, is clamped an inwardly overhanging flexible elastomeric gasket or diaphragm 12, by means of clamp 13. Gasket 12 has a greater width at the end shown on the right of FIG. 1 than that both at the left and along the sides parallel to the plane of the Figure. Around its edges it lies over a support plate 15 which also supports a hinge, shown diagrammatically as numeral 14. The hinge structure is connected to a second enclosure 16 in which the upper bed plate 5 is rigidly mounted. A handle 17 is positioned at the opposing end of enclosure 16 to the hinge and is used to raise or lower enclosure 16 and hence bed plate 5 to enable the circuit board to be inserted or removed. In its lowered position plate 5 rests around its edge upon gasket 12 as shown in FIG. 1. In this lowered position a seal is provided around the area between the two bed plates 5 and 6 by means of support 11 and gasket 12 so that a vacuum may be established within this region.

A narrow rectangular dam 18 is mounted upon lower bed plate 6 such that it surrounds the circuit board under test 1 and defines an inner sub-chamber. The dam is capped around its perimeter by a layer of a resilient elastomer 19. A vacuum pipe 20 is connected to an aperture in lower bed plate 6 which lies outside the region defined by dam 18. In upper bed plate 5 there are additionally included two apertures 21 situated within the region defined by dam 18. An airpipe 22 is inserted through one of these apertures and a non-return flap type valve 23 closes the other aperture.

Each upper electrical probe 2 is electrically connected to a further pair of co-linear probes 24 and 25 which are mounted respectively through bed plates 5 and 6 facing one another such that when the plates are in the position shown in FIG. 1 probes 24 and 25 do not meet to establish electrical contact and conduct a current.

Stop pillars 29 are provided to prevent distortion of the circuit board and excessive compression of the test pins 2, 3, 24, 25.

Use of the invention will now be described in more detail.

Figure 2:
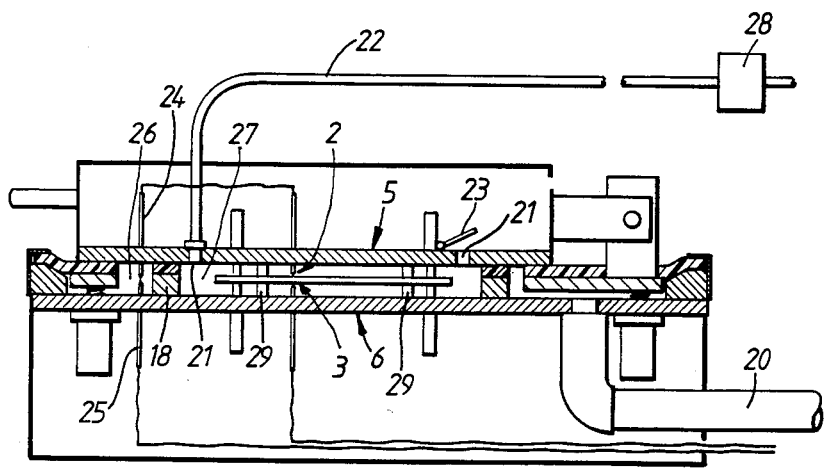
FIG. 2 shows the same apparatus in a second "operating" position.

After a circuit board 1 to be tested has been placed in position on location supports 7, and upper bed plate 5 lowered to the position shown in FIG. 1, the chamber between the two bed plates is evacuated by drawing air out through vacuum pipe 20. The reduction of pressure within this chamber causes upper bed plate 5 to be drawn towards lower bed plate 6. It is drawn downwardly until it reaches the position shown in FIG. 2 where the downward movement is stopped by pillars 29. In this position, the resilient elastomer material of dam 18 forms a tight seal with the base of bed plate 5 and hence an internal chamber 27 is formed which is sealed from the external chamber shown as 26. The dam 18 does of course completely surround the circuit board in the test and also the two apertures 21. It is seen that as the bed-plates approach the second position shown in FIG. 2, probe 2 is lowered as bed plate 5 lowers such that the probe 2 contacts the upper surface of circuit board 1 and further downward movement of the probes, now exerting pressure on the board, causes the circuit board to contact the lower probe 3. Hence both probes are in electrical contact with the circuit board and test signals may be applied to them. In addition, contacts 24 and 25 are connected so that an electrical signal may be passed to upper probe 2. After all the electrical contacts have been made, dam 18 contacts bed plate 5 and the position of FIG. 2 is reached.

At this point, air may be allowed into the inner chamber 27 by opening a valve 28 in the airline 22 to allow air to enter the chamber through aperture 21. The air flows through chamber 27, over and under the circuit board under test, and out of the chamber through non-return valve 23, shown in FIG. 2 in an open position. The provision of an air flow to the inner chamber serves to reinstate atmospheric pressure within the inner chamber. Since this chamber is sealed from the outer chamber it is clear that the outer chamber remains at a reduced pressure. This reduced pressure acting on the outside portions of the bed plates is sufficient to hold the bedplates together against the opposing force of the compression springs 9 and probes 2, 3, 24, 25.

Since after this stage a vacuum is no longer required in the central portion, then the circuit board may be accessed from outside without fear of breaking a vacuum and, for instance, potentiometers or capacitors may be trimmed, switches operated, etc., via suitable accessing means (similar to 23). Furthermore, although the need for a cooling supply of air has been stressed, it need not be air at ambient temperatures which is supplied and air at various pressures and temperatures may be introduced to test a circuit board under different conditions. Similarly other gases, dusts or the like may be introduced to test other environmental factors of the board.

When the test cycle has been completed, air is allowed back into the outer chamber 26 through pipe 20. The pressure within the outer chamber is therefore increased to atmospheric and the compression springs 9 serve to separate the bed plate to the position of Figure 1. This breaks the seal of the inner chamber and also breaks the probe contacts to the circuit board. The cycle is then completed by closing air inlet valve 28 and may be repeated with a different circuit board or different environmental factors etc.

Figure 3:
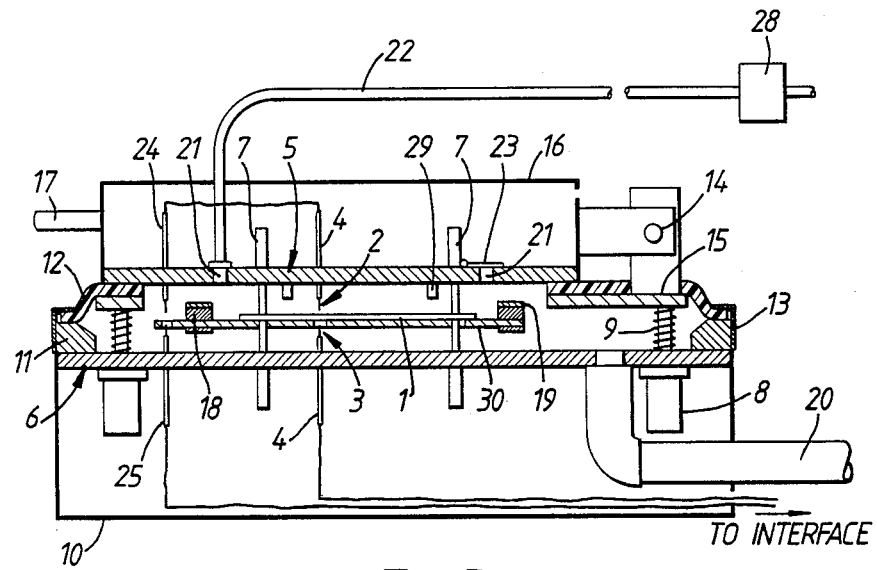
FIG. 3 shows a second apparatus according to the present invention.

FIG. 3 shows an alternative embodiment of the invention wherein the dam 18 is placed on a floating carriage plate 30 positioned between bed plates 5 and 6. The pcb 1 is mounted on and fully supported by plate 30 and is thus less susceptible to distortion due to differences in pressure along its length. Furthermore, the lower set of probes 3 and 25 is fully protected by plate 30 when the bed plates 5 and 6 are drawn towards each other by the reduction in pressure. The provision of plate 30 also eliminates the requirement for lower stops 29 of FIG. 2, since in the fully lowered position the plate rests against lower bed plate 6.

We claim:

1. An electrical interface arrangement for coupling a circuit board to electrical test equipment including two arrays of conductive probes which are spaced apart from each other and at least one of which is attached to a moveable wall portion of an evacuatable chamber, a reduction in pressure of which serves to move the two arrays towards each other so as to sandwich a circuit board between them, and partitioning means (18), actuated by the reduction in pressure, for partitioning the evacuatable chamber into at least a first and a second separate sub-chamber, sealed from each other such that the pressure in one sub-chamber is substantially unaffected by pressure variations in the other chamber.

2. An electrical interface arrangement as claimed in claim 1 wherein the partitioning means includes a dam defining the shape of the first sub-chamber.

3. An electrical interface arrangement as claimed in claim 2 wherein the dam stands proud of a surface of the evacuatable chamber.

4. An electrical interface arrangement as claimed in claim 1 further including a perforated floating plate for mounting the board upon and situated between the two arrays; and wherein the partitioning means is associated with the floating plate.

5. An electrical interface arrangement as claimed in claim 1 wherein the two conductive probe arrays are mounted entirely within the region defined by the first subchamber.

6. An electrical interface arrangement as claimed in claim 1 including gas input and output means associated with the first subchamber.

7. An electrical interface arrangement as claimed in claim 1 including resilient means and pressure equalisation means acting in cooperation to separate the conductive probe arrays when desired.

8. An electrical interface arrangement as claimed in claim 7 wherein the resilient means includes one or more compression springs, adapted to be compressed when the two arrays move towards each other.

9. An electrical interface arrangement as claimed in claim 7 wherein the pressure equalisation means comprise gas input means associated with the second subchamber.

10. An electrical interface arrangement as claimed in claim 1 including means for making electrical paths between the test equipment and one array of the probes which is assoicated with one surface of the circuit board by action related to the reduction in pressure.

11. An electrical interface arrangement as claimed in claim 1 adapted such that, in operation, electrical contact is made between the probe arrays and circuit board before the partitioning means have completely separated the first and second subchambers.

12. An electrical interface arrangement as claimed in claim 1, including means for allowing access to the circuit board whilst the probe arrays remain in contact with it.

* * * * *